United States Statutory Invention Registration [19]

[11] Reg. Number: H763

Feygenson [43] Published: Apr. 3, 1990

[54] SUBMICRON BIPOLAR TRANSISTOR WITH EDGE CONTACTS

[75] Inventor: Anatoly Feygenson, Exeter Township, Berks County, Pa.

[73] Assignee: Bell Telephone Laboratories, Incorporated, Murray Hill, N.J.

[21] Appl. No.: 328,701

[22] Filed: Mar. 21, 1989

Related U.S. Application Data

[63] Continuation-in-part of Ser. No. 92,015, Sep. 20, 1987, abandoned.

[51] Int. Cl.[4] ..... H01L 29/72; H01L 29/04

[52] U.S. Cl. ..... 357/34; 357/59; 437/193

[56] References Cited

U.S. PATENT DOCUMENTS

| | | | |
|---|---|---|---|
| 4,252,582 | 2/1981 | Anantha | 148/175 |
| 4,303,933 | 12/1981 | Horng | 357/50 |
| 4,318,751 | 3/1982 | Horng | 148/1.5 |
| 4,481,706 | 11/1984 | Roche | 29/577 |
| 4,495,010 | 11/1985 | Kranzer | 148/175 |
| 4,551,906 | 11/1985 | Ogura | 29/571 |
| 4,586,968 | 5/1986 | Coello-Vera | 148/188 |
| 4,663,831 | 5/1987 | Birrittella et al. | 357/59 |
| 4,696,097 | 9/1987 | McLaughlin et al. | 357/59 |

*Primary Examiner*—Thomas H. Tarcza
*Assistant Examiner*—Linda J. Wallace
*Attorney, Agent, or Firm*—Wendy W. Koba

[57] ABSTRACT

A new sub-micron bipolar transistor structure is proposed which utilizes narrow horizontal conducting layers between the edges of the active areas and the associated metal contacts. This structure allows the formation of a completely vertical transistor structure and eliminates the need for the extended buried collector and collector reach-through diffusion regions.

5 Claims, 4 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

SUBMICRON BIPOLAR TRANSISTOR WITH EDGE CONTACTS

This application is a continuation-in-part of application Ser. No. 092,015, filed on Sept. 20, 1987, now abandoned.

BACKGROUND OF THE INVENTION

1. Technical Field

This invention relates to a submicron bipolar transistor and, more particularly, to such a device formed with horizontal conducting layers between the sidewall edges of the active regions and the metal contacting electrodes.

2. Description of the Prior Art

The direction of technology in the field of semiconductor devices is toward a device structure with high speed and low power consumption. This structure demands active regions which are shallow in depth and placed as close together as possible.

One exemplary process for fabricating relatively small bipolar devices is disclosed in U.S. Pat. No. 4,481,706 issued to M. Roche on Nov. 13, 1894. Roche utilizes vertical layers of oxide and nitride on the sidewalls of the region where a base implant has been made to define the outer boundaries of the emitter region. The thickness of the oxide and nitride layers thus results in providing an extremely narrow emitter region. An alternative fabrication method is disclosed in U.S. Pat. No. 4,495,010 issued to D. Kranzer on Jan. 22, 1985 wherein ion implantation of an undoped polysilicon layer is used to form base and emitter regions which are very thin and also very small.

A problem with these and similar prior art configurations is the requirement of a buried collector region with a relatively large lateral extension so as to provide for the connection to a collector electrode on the top surface of the device. An additional implant between the device surface and this buried region (this implant is commonly referred to as a collector reach-through) is thus required to complete the connection between the collector diffusion and the surface electrode. This obviously results in the formation of a device which covers a larger substrate surface area than is actually required to perform the transistor function.

There exist lateral bipolar transistor structures which eliminate the need for a buried collector region by forming the collector, base, and emitter regions as adjacent diffusions at the surface of the substrate. Examples of this structure may be found in U.S. Pat. No. 4,641,170 issued to S. Ogura et al on Feb. 3, 1987. However, device size and speed limitations still remain with this lateral structure.

A size limitation that exists with virtually every bipolar device structure is the required separation between the electrical contacts to the device areas. Most notably, the conventional device structures described above which use an extensive lateral buried subcollector, resulting in the formation of a collector electrical contact far removed from the base and emitter electrodes.

In light of the above, there remains a need in the prior art for a bipolar device which is small in size and capable of achieving high speed operation, which requires neither the use of a large buried collector region nor the formation of a lateral transistor diffusion region.

SUMMARY OF THE INVENTION

The need remaining in the prior art is addressed by the present invention which relates to a submicron bipolar transistor structure and, more particularly, to such a structure which utilizes narrow horizontal conducting layers between the edges of the diffusion regions and the metal contacting electrodes.

It is an aspect of the present invention to eliminate the need for an extended buried sub-collector and a collector reach-through region, as common in the prior art, by utilizing in its place a horizontal conducting layer between the edge of the collector region and its associated metal contact.

The horizontal conducting layer may comprise a single layer of appropriately-doped polysilicon, or a combination of a layer of doped polysilicon and a layer of silicide. The relatively low sheet resistance of the silicide allows for the overall resistance of the horizontal conducting layer to be significantly reduced.

The various aspects and advantages of the present invention may be readily understood from the following description and reference to the following drawings.

BRIEF DESCRIPTION OF THE DRAWING

Referring to the drawings.

DETAILED DESCRIPTION

The complete fabrication process which may be used to form the transistor structure of the present invention will now be described in sufficient detail so as to allow one skilled in the art to fabricate such a device. It is to be understood that a device of complementary structure can be fabricated merely by changing the dopants used to form the various n and p regions.

Figure 1:
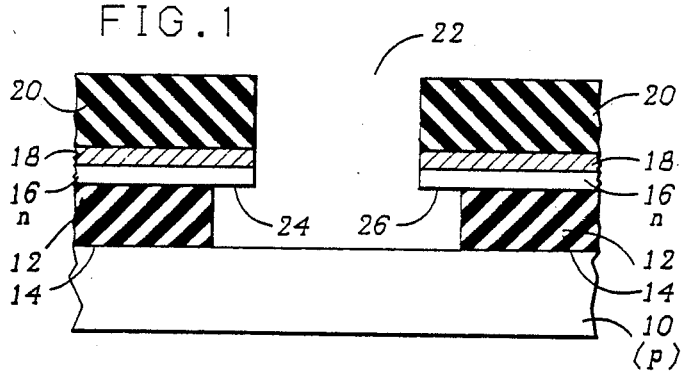
FIGS. 1–12 illustrates the fabrication process of an exemplary submicron bipolar transistor formed in accordance with the present invention, FIGS. 4 and 5–8 illustrating alternative techniques of forming certain structures within the final device.

FIG. 1 contains a vertical cross-section of the present device at an early stage in the fabrication process. The starting material is a silicon substrate 10 which is doped to comprises a p-type conductivity. A thick oxide layer 12, which may be a low-temperature oxide (LTO) is then grown to cover the top major surface 14 of substrate 10. A polysilicon layer 16 of n-type conductivity and a silicide layer 18 are sequentially deposited over oxide 12. It is a portion of this pair of layers 16 and 18 which will form the horizontal collector contact of the final device. Another thick oxide layer 20 is than grown to substantially cover silicide 18. This structure is then appropriately masked and etched to open windows 22 at the desired transistor locations. For example, a first etch may be used to remove the appropriate region of thick oxide 20. A second etch may then be used to remove silicide 18, polysilicon 16 and oxide 12. As seen by reference to FIG. 1, the second etch used in this exemplary embodiment is preferential with respect to oxide 12, that is, oxide 12 is removed at a faster rate than polysilicon 16 and silicide 18. This results in the formation of undercut regions 24 and 26. As described in detail hereinafter, the formation of these regions is discretionary in accordance with the formation of the device of the present invention.

Subsequent to this etch, a polysilicon layer 28 is deposited to cover the exposed surface of the device structure. As is well-known in the art, polysilicon will form a conformal coating, flowing to cover all exposed edges. This aspect of polysilicon coverage is clearly illustrated in FIG. 2. In the final device structure, polysilicon 28 must be of n-type conductivity. Accordingly, an undoped layer of polysilicon may be deposited to form layer 28 and subsequently subjected to an ion implantation process, using an n-type ion (arsenic, for example) which results in converting polysilicon 28 to n-type polysilicon. Alternatively, in-situ doped polysilicon (n-type) may be directly deposited over the exposed surface. Either process results in the formation of the same structure, with the advantage of ion implantation being that the depth and amount of n-type conductivity can be more well-controlled.

Figure 2:
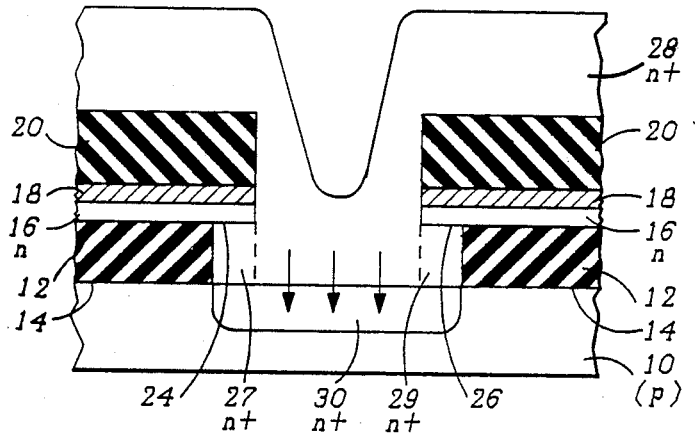

A thermal treatment of sufficient temperature and duration follows to drive the n+ ions present in polysilicon 28 through top major surface 14 of substrate 10, as indicated by the arrows in FIG. 2. This process results in the formation of n+ buried collector region 30. Assuming that the exemplary transistor was formed to contain overhang regions 24 and 26, and that undoped polysilicon was used to form layer 28, the thermal drive-in treatment will also result in the conversion of regions 24,26 to n-type polysilicon vertical contact regions 27,29.

Figure 3:
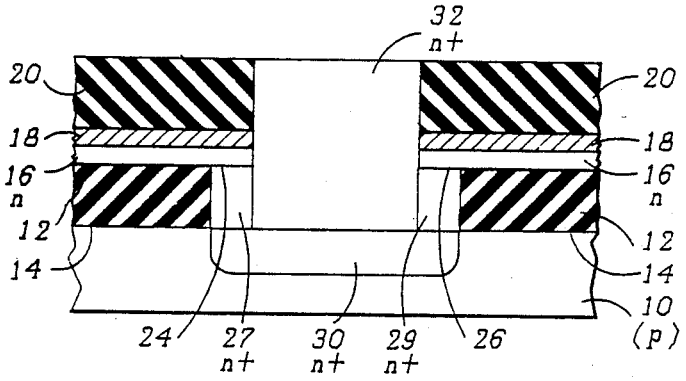
Figure 4:
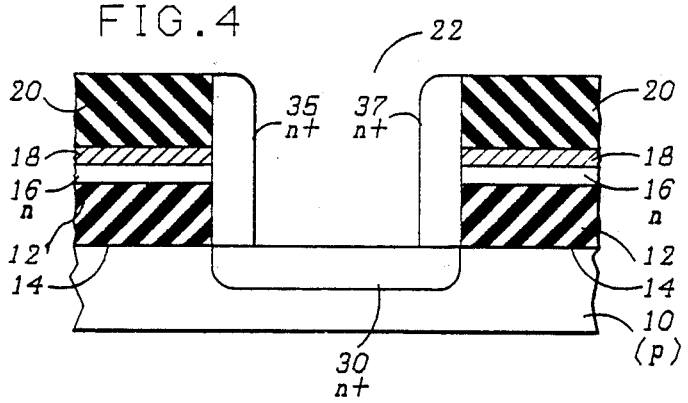

Continuing with the description of the fabrication process, a reactive ion etch (RIE) is next used to remove all horizontally exposed portions of n-type polysilicon 28, as indicated in FIG. 3. Vertical n-type contact regions 27,29 will remain after the RIE is performed, since they are protected by overhangs 24,26. It is to be noted that if the overhang procedure was not used, this RIE etch will leave vertical sidewalls 35,37 of n-type polysilicon in window 20 (see FIG. 4). Referring back to FIG. 3, an n-doped epitaxial region 32 is next grown in window 20 subsequent to the RIE process. Region 32 will form the contact region to buried collector 30 in the final device structure.

The next set of fabrication steps, related to the formation of a base region, are illustrated in FIGS. 5–8, which relate to two alternative fabrication methods. Similar to the horizontal collector contact, the horizontal base conducting layer of this exemplary arrangement utilizes a polysilicon layer 34, which is p-doped to match the conductivity of the base region, and a silicide layer 36 deposited over p-doped polysilicon 34. As with polysilicon layer 28, p+ polysilicon layer 34 may be either doped in-situ during deposition, or deposited undoped and subsequently subjected to an ion implantation (with boron, for example).

Figure 5:
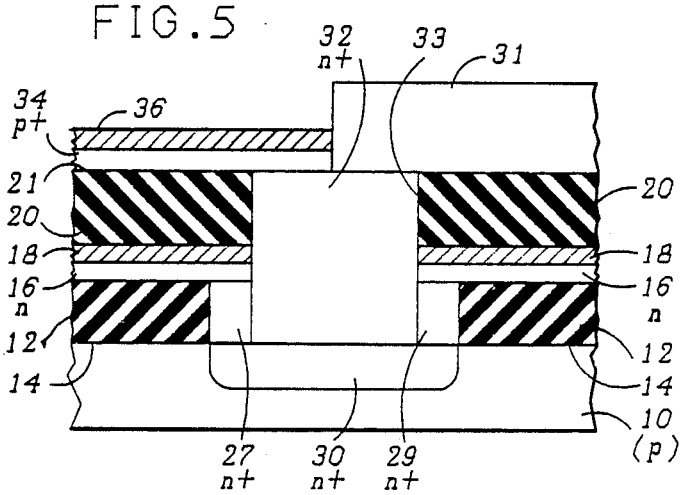
Figure 6:
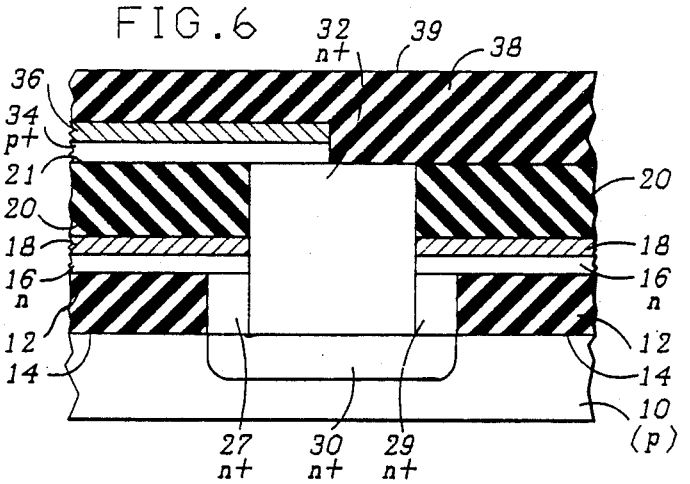

In order to eliminate any possible contact between the horizontal base conducting layer and the final vertical contact to the collector conducting layer (not shown), the structure must be appropriately masked to block the formation of the horizontal base conducting layers in strategic areas, or alternatively, the layers must be removed from these strategic areas before the final insulating oxide 38 is grown. The former alternative is illustrated in FIGS. 5 and 6, the latter in FIGS. 7 and 8. Referring to FIG. 5, insulating layer 20, including n+ epitaxial region 32 is covered with a mask layer 31 which extends at least to edge 33 of n+ epitaxial region 32, thus exposing the left-hand side of the structure. P-doped polysilicon 34 and silicide 36 are then deposited in the exposed area. Subsequent to the deposition, mask 31 is removed and oxide 38 is grown to cover the full surface of the device, as shown in FIG. 6. Planarization techniques, well-known in the art, may be utilized to achieve a flat top surface 39 of oxide 38.

Figure 7:
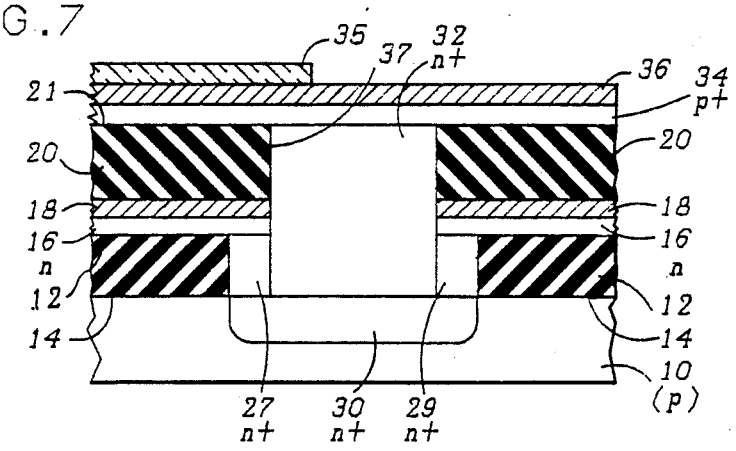
Figure 8:
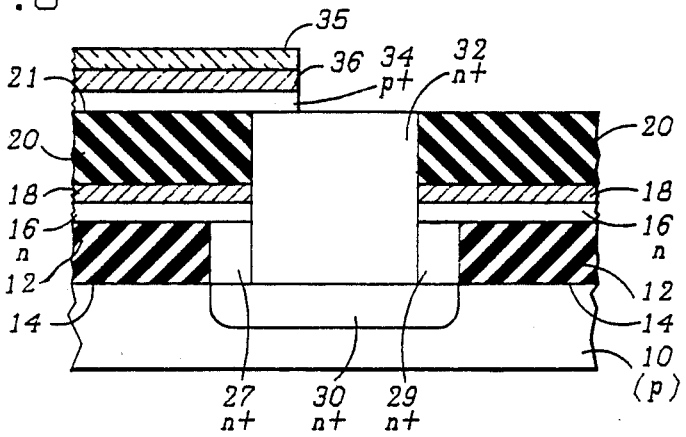

In the alternative process, as shown in FIG. 7, p-doped polysilicon 34 and silicide 36 are deposited to completely cover top surface 21 of oxide 20 (and n+ epitaxial region 36). Silicide 36 is then covered by a mask layer 35 in the region where the horizontal base contact is to be formed. Mask 35 must extend at least to edge 37 of n+ epitaxial region 36 to insure proper device formation. The exposed portions of layers 34,36 are then removed with a suitable etchant to form the structure shown in FIG. 8. Mask 35 is then removed and oxide 38 grown to provide a structure virtually identical to that illustrated in FIG. 6.

It is to be understood that other techniques may exist for forming these selected areas of polysilicon and silicide. The two alternatives illustrated in FIGS. 5–8 are considered to be merely two such illustrative techniques. Further, the removal of polysilicon and silicide from the right half of the structure, instead of the left, is purely arbitrary. Obviously, the masking regions may be formed to yield the opposite results. The result of removing the silicide and polysilicon from the right side is merely that the final vertical collector contact (not shown) must be formed in this area.

Figure 9:
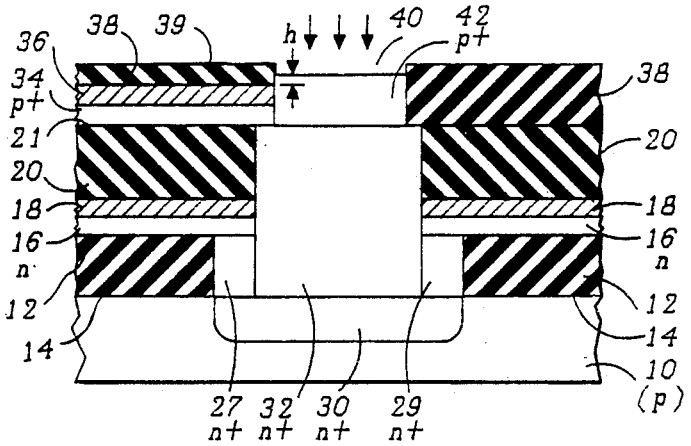

Regardless of the procedure used, the device structure as shown in FIG. 6 is subsequently masked and etched to form a window 40 to expose n+ epitaxial region 32. It is to be noted that this mask need not be perfectly aligned and sized with epitaxial region 32. Subsequent to the etch, the epitaxial growth process is reinitiated to form an additional epitaxial region 42 in window 40, as shown in FIG. 9. Region 42 is grown to a predetermined height h, above silicide 36, but somewhat below top surface 39 of oxide layer 38. The reason for stopping the growth before reaching the top of oxide 38 will become obvious at a later step in the fabrication process. Region 42 is then ion implanted with a p-type dopant to form the p-type base region of the transistor. This implant must be accomplished with an energy sufficient to drive the ion implant to at least the depth of p+ polysilicon layer 34, since the combination of polysilicon 34 and silicide 36 form the horizontal conducting layer between base 42 and the surface base electrode (illustrated in a later figure).

Figure 10:
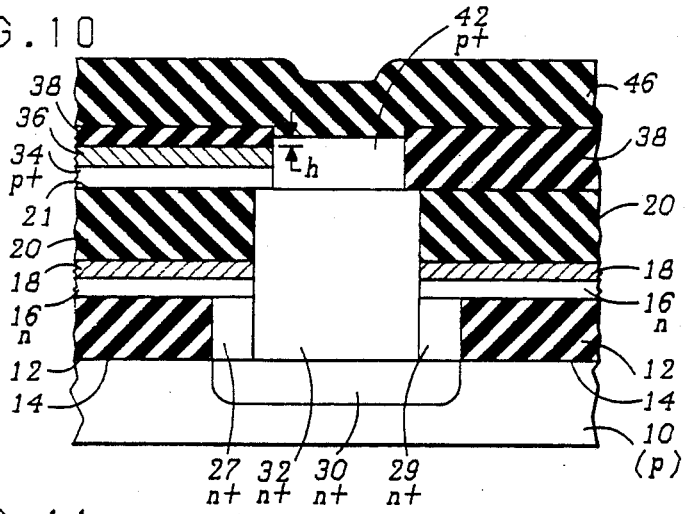
Figure 11:
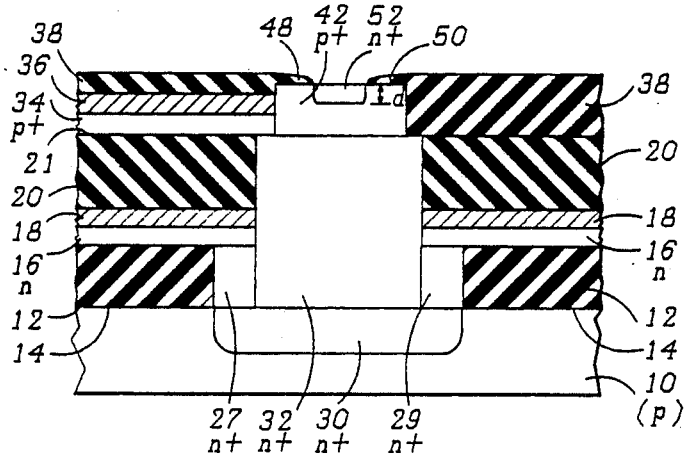

The formation of the emitter region is illustrated in FIGS. 10 and 11. A thick oxide layer 46 is first grown to cover the top surface of the device, as shown in FIG. 10. The structure is then subjected to an RIE to remove horizontal portions of layer 46, leaving vertical fillets 48 and 50, this structure being illustrated in FIG. 11. The size of fillets 48 and 50 is thus controlled by the defined height, h, of region 42. Emitter 52 is then formed in the center region of base 42, defined at the edge boundaries by fillets 48 and 50. Thus, by using vertical fillets 48 and 50, the emitter will be self-aligned with respect to the base region. The emitter region is formed by an ion implantation with an n-type dopant, where the dosage and energy of the implant are controlled to provide an emitter with the required depth d.

Figure 12:
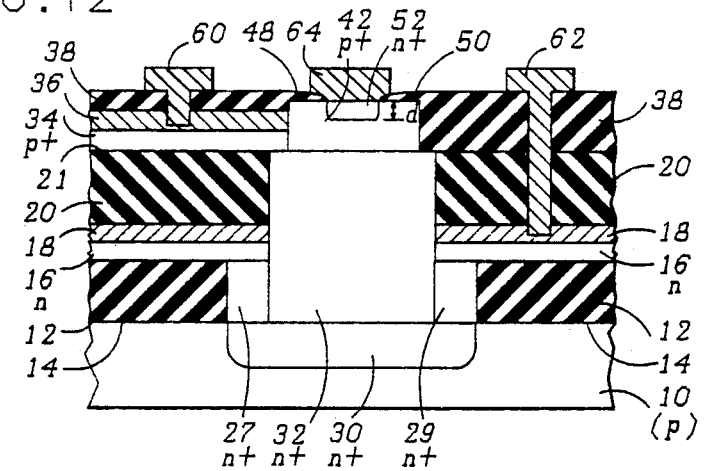

FIG. 12 illustrates the final device structure, including the metallic contacts to the collector, emitter and base. In particular, base contact 60 is formed by opening a trench in the surface to reach silicide layer 36. As described above, the horizontal combination of p+ polysilicon layer 34 and silicide 36 form the electrical conducting path between metal contact 60 and base region 40. Silicide 36, with a sheet resistance on the order of 0.5–4.0 ohm/square, as compared with the 10–100 ohm/square resistance of p+ polysilicon 34, is utilized to decrease the series resistance between base contact 60 and base region 42. Since layers 36 and 34 are electrically in parallel, the resistance of silicide 36 will dominate and therefore the resistance between contact 60 and base region 42 will be essentially that of silicide 36. It is to be understood, however, that if series resistance is not a design concern, silicide layer 36 may be left out and p+ polysilicon layer 34 used as the horizontal contact layer.

The contact to collector 30 is provided by a collector contact 62 which is formed to a depth of at least silicide layer 18. Utilizing the overhang areas, region 29 forms a vertical contact between buried collector 30 and the horizontal collector contact layers 16 and 18. As described above in association with the base contact, silicide layer 18 is used to lower the resistance between collector contact 62 and buried collector 30. If this resistance is not a concern, silicide layer 18 may be left out of the final device structure. As seen by reference to FIG. 12, it is necessary to remove the portions of horizontal base conducting contact 62, as described above in association with FIGS. 5–8, in order to insulate collector contact 62 from the base region.

It is to be noted that the above description related to the formation of an npn submicron bipolar transistor structure. It is obvious that the polarities of these regions may be easily reversed, and the structure defined above made in the form of an pnp submicron bipolar transistor.

What is claimed is:

1. A bipolar transistor comprising a semiconductor substrate of a first conductivity type having predefined top and bottom major surfaces;

a buried collecting region of a second conductivity type formed in a selected region of said semiconductor substrate, extending downward a predetermined depth from the semiconductor substrate top major surface;

a collector region of the second conductivity type, including top and bottom major surfaces with vertical sidewalls extending therebetween, disposed over said buried collector region and extending upward from said semiconductor substrate top major surface such that the bottom major surface of said collector region is in contact with the top major surface of said substrate;

a base region of the first conductivity type and including top and bottom major surfaces with vertical sidewalls extending therebetween, said base region bottom major surface formed to contact the top major surface of said collector region;

an emitter region of the second conductivity type formed in a centrally located portion of said base region, extending downward into said base region from the base region top major surface;

a horizontal collector conducting layer of the second conductivity type extending from a sidewall of the collector region at a predetermined height above said semiconductor substrate top major surface;

a collector isolation region formed between the base region top major surface and said semiconductor substrate top major surface so as to surround the horizontal collector conducting layer;

a horizontal base conducting layer of the first conductivity type extending from a sidewall of said base region at a predetermined height above said semiconductor substrate top major surface;

a base isolation region formed between the base region top major surface and said semiconductor substrate top major surface so as to surround the horizontal base conducting layer;

collector ohmic contact means extending downward through the collector isolation region to contact the horizontal collector conducting layer;

base ohmic contact means extending downward through the base isolation region to contact the horizontal base conducting layer; and emitter ohmic contact means disposed to contact the emitter diffusion region.

2. A bipolar transistor as defined in claim 1 wherein the horizontal collector conducting layer comprises a layer of polysilicon doped to comprise the second conductivity type; and the horizontal base conducting layer comprises a layer of polysilicon doped to comprise the first conductivity type.

3. A bipolar transistor as defined in claim 2 wherein the horizontal collector conducting layer further comprises a layer of silicide disposed to cover the doped polysilicon layer; and the horizontal base conducting layer further comprises a layer of silicide disposed to cover the doped polysilicon layer.

4. A bipolar transistor as defined in claim 1 wherein the transistor further comprises a vertical connection region of the second conductivity type formed adjacent to the sidewall of the collector region between the semiconductor top major surface and the horizontal collector conducting layer, said vertical connection region for electrically connecting the buried collector region to the horizontal collector conducting layer.

5. A bipolar transistor as defined in claim 1 wherein the first conductivity type is defined as p-type conductivity and the second conductivity type is defined as n-type conductivity.

* * * * *